United States Patent [19]
Montier

[11] 3,990,927
[45] Nov. 9, 1976

[54] METHOD FOR ISOLATING THE COMPONENTS OF AN INTEGRATED CIRCUIT

[75] Inventor: Michel Montier, Meylan, France

[73] Assignee: Commissariat a l'Energie Atomique, Paris, France

[22] Filed: Nov. 15, 1974

[21] Appl. No.: 524,320

[30] Foreign Application Priority Data
Nov. 23, 1973 France .............................. 73.41873

[52] U.S. Cl. .................................... 156/8; 156/17; 427/85; 427/93
[51] Int. Cl.² ........................................ H01L 7/50
[58] Field of Search .................. 29/571; 156/3, 7, 8, 156/17; 427/82, 85, 88, 93, 256; 148/191; 357/47, 48

[56] References Cited
UNITED STATES PATENTS

| | | |
|---|---|---|
| 3,144,366 | 8/1964 | Rideout et al. ........................ 156/17 |
| 3,425,879 | 2/1969 | Shaw et al. ............................ 156/17 |
| 3,519,504 | 7/1970 | Cuomo ................................... 156/17 |
| 3,640,782 | 2/1972 | Brown et al. .......................... 156/17 |
| 3,675,314 | 7/1972 | Levi ....................................... 156/17 |

OTHER PUBLICATIONS
IBM Tech. Discl. Bull., V. Y. Doo, "Selective Etch of Silicon Nitride Films", vol. 13, No. 9, Feb. 1971, p. 2468.
IBM Tech. Discl. Bull., V. Y. Doo, "High Capacitance PN Junction Capacitors By Etch-Refill Method", vol. 9, No. 7, Dec. 1966, p. 920.

*Primary Examiner*—William A. Powell
*Attorney, Agent, or Firm*—Cameron, Kerkam, Sutton, Stowell & Stowell

[57] ABSTRACT

The method of isolating integrated circuit components on a conductive silicon wafer having a deep layer isolated from a surface layer consists in forming a first deposit of low density on each surface zone in which an integrated circuit component is to be implanted while leaving an uncoated strip which separates each deposit from adjacent deposits, in forming a channel corresponding to each strip within the surface layer and partly within the deep layer, in performing selective deposition of silica on the entire wafer so as to fill the channels up to the bottom of the first deposits, and in removing the first deposits so as to leave insulating silica walls around the surface zones.

12 Claims, 9 Drawing Figures

METHOD FOR ISOLATING THE COMPONENTS OF AN INTEGRATED CIRCUIT

This invention relates to a method for isolating the different components of an integrated circuit.

An integrated circuit is generally understood to mean an assembly of semiconductor components such as bipolar transistors, MOS transistors, diodes, resistors and the like which are fabricated by doping in a single wafer of semiconductor materials such as silicon, for example. These various components must be connected to each other in order to form a given circuit. Since all the components are located on one and the same semiconductor substrate, it is necessary to isolate them electrically from each other.

In point of fact, the junctions which exist between the active portions of the components and the substrate form parasitic diodes which are liable to disturb the operation of the circuit to a very considerable extent.

In order to overcome these disadvantages, it has been found necessary to isolate the components from each other, thereby eliminating parasitic diodes or stray capacitances.

A certain number of techniques for obtaining this isolation are already known. In some techniques, heavily doped zones are formed in order to isolate that portion of silicon which is placed within said heavily doped zones. In other techniques, a box of insulating material is formed around the entire portion of semiconductor in which one of the components is to be implanted.

In the first group of techniques, there can be mentioned the construction of isolating boxes by diffusion from a semiconductor wafer having a deep p-type zone, for example, on which is developed by epitaxial growth an n-type surface zone in which the components are to be implanted.

A p+ type zone is diffused around the n-type zone in which the component is to be formed, thus isolating the n-type zone from the remainder of the n-type layer of the substrate.

A first disadvantage of this technique lies in the fact that if it is desired to obtain effective isolation, considerable stray capacitances are created between the n-type zones and the p+ type zones. Furthermore, the p+ type diffusion must pass through the entire n-type layer and this diffusion therefore takes a very long time.

The second technique is well known and is commonly designated by the name of EPIC insulation technique.

This technique has the advantage of completely surrounding the semiconductor zone with an electrical insulator such as silica. The main difficulty of this technique lies in the obtainment of an eroded surface which is strictly parallel to the bottom of the box. This technique is fairly difficult to apply with reliable results and is relatively costly.

The present invention is precisely directed to a method for isolating the components of an integrated circuit which overcomes the above-mentioned disadvantages by making it possible to obtain isolation of components from each other by means of a wall of insulating dielectric material such as silica without however entailing operations as difficult as those involved in the EPIC method.

The method of isolation of different components of an integrated circuit formed on a single wafer of conductive silicon having a surface layer and a deep layer isolated from the surface layer essentially consists in forming a first deposit of a substance said substance producing by oxidation or chlorination during deposition of the silica a compound having a density appreciably lower than the density of said substance on the surface zones of the wafer corresponding to the zones in which it is desired to implant said components in such a manner as to ensure that each deposit is separated from adjacent deposits by a strip on which a deposit is not formed; in forming a channel directly beneath each of said strips within the surface layer, said channel being intended to penetrate to a slight extent into said deep layer, in carrying out selective deposition of silica on the entire wafer so as to ensure that the silica which fills said channels is brought level with the bottom portion of said first deposits, and in removing said first deposits by means of a specific solvent so that the remaining silica constitutes insulating walls around said surface zones.

A first alternative mode of execution consists in carrying out a deposition of doped silica and in forming a uniform deposit of silica in a gas phase and in an oxidizing medium over the entire wafer, thus giving rise to swelling of the substance constituting said first deposit and to a break in the portion of silica which covers said substance and in removing said portion by means of a specific solvent for doped silica.

In a second alternative mode of execution, the selective silica deposit is obtained by subjecting the substrate to a gas flow containing silane and oxygen.

A better understanding of the invention will in any case be obtained from the following description of several modes of execution of the method according to the invention, reference being made to the accompanying drawings, wherein.

The different stages of the method of isolation in accordance with the invention are shown in FIG. 1.

There is initially employed a silicon wafer 84 having an n-type (or p-type) surface layer 86 and a p-type (or n-type) deep layer 88 (it would also be possible to start from a wafer consisting of silicon on isulating material). By way of example, the n-type layer can be obtained by epitaxial growth. There is formed over the entire top surface of the layer 86 a uniform deposit 90 of molybdenum for example by vaporization.

Figure 1A:
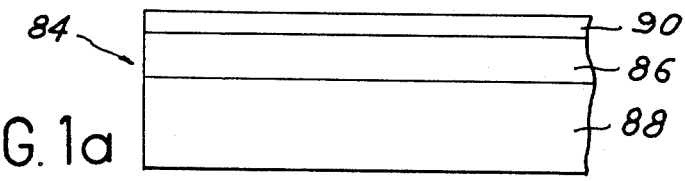
FIGS. 1a to 1e are diagrams in perspective illustrating the different stages of a first mode of execution of the method.
Figure 1B:
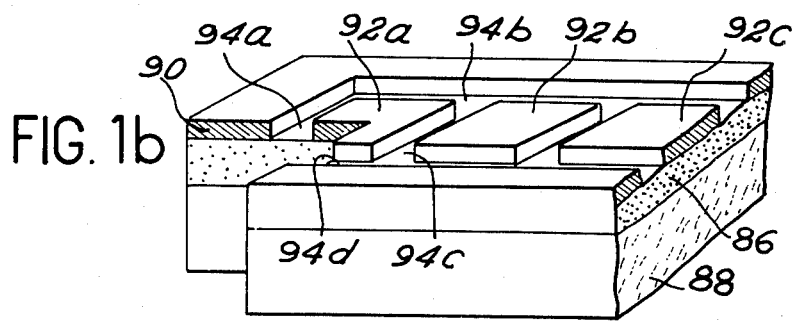
Figure 1C:
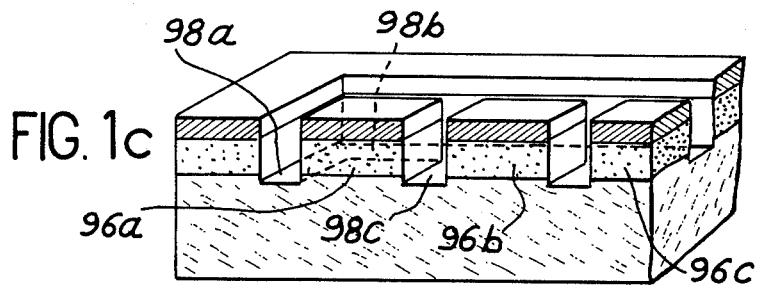
Figure 1D:
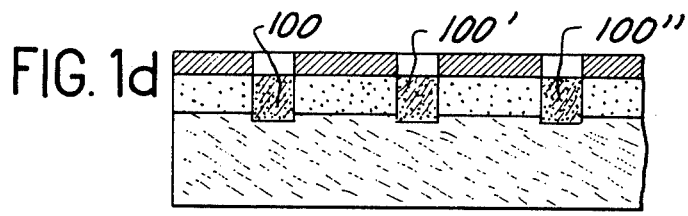
Figure 1E:
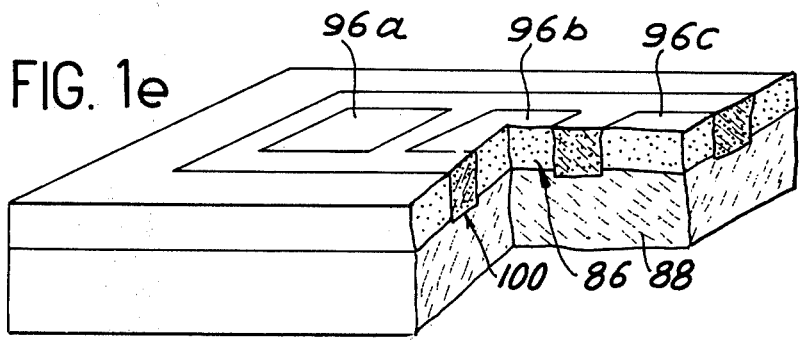

In the following stage shown in perspective in FIG. 1b, the molybdenum layer 90 is etched so as to leave only the deposits (92a, 92b, 92c) corresponding to those regions of the wafer 84 in which the components are subsequently to be implanted. Each deposit is separated from adjacent deposits and from the remainder of the molybdenum by strips from which molybdenum has been removed (for example the strips 94a, 94b, 94c, and 94d in the case of the deposit 92a).

During the following stage (shown in perspective in FIG. 1c), the silicon layer 86 is etched directly beneath the strips from which molybdenum has been removed. Each portion of the layer 86 which is placed beneath a deposit of molybdenum is thus separated from the portions placed beneath the adjacent deposits of molybdenum by a channel which completely surrounds said portion and penetrates to a slight extent into the deep layer 88. For example, the portion 96b which is placed beneath the molybdenum deposit 92b is isolated from the portions 96a and 96c which are placed respectively beneath the deposits 92a and 92c by a channel constituted by the elements 98a, 98b, 98c and by a fourth element which is not shown in FIG. 2c.

There is then carried out a selective deposition of silica on the top face of the wafer in accordance with either of the variants of the method of selective deposition which have already been described. The channels surrounding the portions 96a, 96b, 96c are thus filled with silica without having any silica on the molybdenum deposits. There is thus obtained around each portion 96a, 96b, 96c a "wall" of silica, the sections of said wall (as designated by the references 100, 100′, 100″) being shown in FIG. 1d.

Figure 2A:
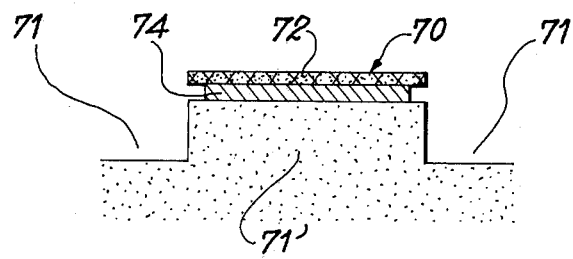
FIGS. 2a to 2d are vertical sectional diagrams illustrating an alternative mode of selective deposition.
Figure 2B:
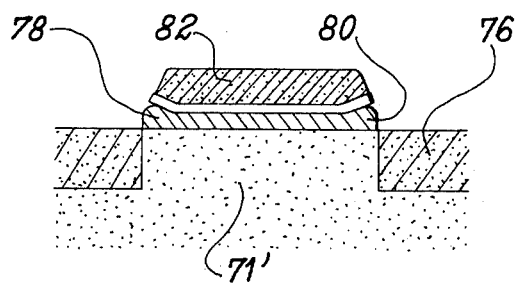
Figure 2C:
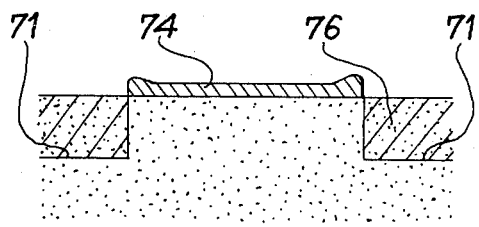
Figure 2D:
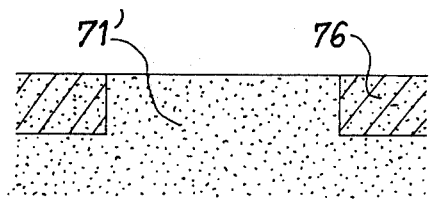

In a final stage (as shown in FIG. 10), the deposits of molybdenum 92a, 92b, 92c are removed by means of a specific solvent for molybdenum such as, for example, the solvent which has already been employed for etching the stage shown in FIG. 2b. The top surface of the silicon is then free of silica. Around each portion 96a, 96b, 96c, there is no overthickness of silica corresponding to the wall of silica.

Each portion 96a, 96b, 96c of silicon is thus isolated from the adjacent portions by means of said silica walls which extend into the deep silicon zone 88.

The resultant structure has a flat surface and this constitutes a first advantage. A further advantage arises from the fact that an insulating wall takes up considerably less space than a diffused wall (by reason of the space charge extensions which have to be guaranteed).

The method which has been described in connection with molybdenum can also be carried out by means of a certain number of other metallic elements such as vanadium, chromium, rhenium, technetium and so forth. In general, these elements must result in either solid or gaseous compounds having densities which are appreciably lower than that of the metal under the action of suitable reagents such as, for example, oxygen or hydrochloric acid, as will be explained hereinafter.

It is also possible to employ compounds of said metallic elements and preferably oxides which are capable of producing in the presence of oxygen, either under the action of heat or under the action of suitable reagents, other solid compounds of lower density or volatile compounds of said metallic elements.

There are shown in FIG. 2 the different stages 2a, 2b, 2c, 2d of the first variant of the method of selective deposition of silica which is employed in order to form the insulation.

A deposit of molybdenum is followed by a deposit of silica which is doped with phosphorus for example in the gas phase. There is employed for this purpose the gas mixture $PH_3$ and $SiH_4$ with concentrations such as to produce the relation:

$$0.05 < \frac{\text{Flow rate } PH_3}{\text{Flow rate } SiH_4} < 0.2$$

These two layers are etched, thus forming the pad 70 (shown in FIG. 2) which is constituted by a layer 74 of molybdenum and a layer 72 of doped silica. The molybdenum layer 74 is slightly overetched in order to leave the silica layer with a small overhung portion or projecting edge. The channel 71 surrounding the zone 71′ to be isolated is etched at the same time. The layer 70 has a thickness of the order of 2000 A and the layer 74 has a thickness at least equal to 2000 A. There is then performed a deposition of non-doped silica 76 over the entire substrate at a temperature of the order of 400° C in an oxidizing gaseous medium (oxygen). The molybdenum swells (as shown at 78 and 80) as it oxidizes both at the surface and along the edges. The deformation of the doped silica layer 72 caused by mechanical stresses arising from differences in coefficients of expansion of the silica, the doped silica and the molybdenum and from swelling of the molybdenum layer results in the structure shown in FIG. 2b. There is a break in the portion 82 of the silica layer 76 which results in the appearance of the "section" corresponding to the doped silica layer 72. Furthermore, the doping phosphorus migrates from the doped layer 72 towards the silica layer 82 which is formed above the pad 70. The use of a selective solvent for phosphorus-doped silica results in very rapid attack on the layer 72 and at the same time in removal of the non-doped silica layer 82. There is then obtained the structure shown in FIG. 2c in which the molybdenum contact surface 74 is free of silica whereas the channel 71 is filled with silica which constitutes the insulating wall. In a final stage 2d, the molybdenum is removed as indicated earlier.

This alternative form of construction combines the advantages of selective attack on silica doped with phosphorus and the break in the portion 82. Solely by way of explanation, the swelling of the molybdenum can be interpreted as being due to its oxidation which results in the compound $MoO_3$ by reason of the highly oxidizing medium. Since the ratio of densities of molybdenum oxide to molybdenum is 0.5, swelling of the molybdenum is accordingly obtained.

It is possible in this alternative form of construction to start not from a molybdenum layer but from a layer of a molybdenum compound and to produce the swelling by transforming said compound so as to form another compound having an appreciably lower density. It is also possible to form an initial deposit of molybdenum oxide on the desired zones and then to employ hydrogen chloride gas which transforms the molybdenum oxide into oxychloride which has a lower density.

The second alternative mode of selective deposition is carried into effect at the time of deposition of the silica in the gas phase in the vicinity of 400° C and consists in initiating the formation of a compound above the zones which are covered with molybdenum in order to prevent the formation of silica on the molybdenum. This compound is a volatile oxide of molybdenum produced at the time of deposition of silica in an oxidizing atmosphere. The compound can also be a volatile chloride or oxychloride.

In order to obtain the result just mentioned, a small proportion of hydrogen chloride gas is added to the silane carrier gas and to the oxygen which is necessary for the formation of the silica. This accordingly results in sublimation of a small proportion of the molybdenum so as to yield a volatile compound of the hydrogen chloride type. This evolution prevents the deposition of silica on the molybdenum. The mole percent of hydrogen chloride in the carrier gas can advantageously be of the order of 0.4 % whilst the mole percent of oxygen can be of the order of 2.5 %. Preliminary oxidation of the molybdenum has the effect of assisting the sublimation process.

This second alternative mode of execution can also be carried into effect by forming the desired zones directly in a molybdenum compound and preferably the oxide by subjecting this latter to conditions which are conducive to sublimation. This can take place simply as a result of a temperature rise or in the presence of a suitable reagent such as hydrogen chloride gas, for example.

This alternative mode of selective deposition was employed at the time of stage 1*d* of the method of construction of insulating walls as described in the foregoing.

What we claim is:

1. A method of isolation of different components of an integrated circuit formed on a single wafer of conductive silicon having a surface layer and a deep layer electrically isolated from the surface layer, the deep layer having an opposite conductivity to that of the surface layer or being of electrically insulative material the steps of forming a first deposit of a substance on the surface zones of the wafer corresponding to zones in which said components will be implanted with each deposit separated from adjacent deposits by a strip free of deposit, forming a channel directly beneath each of said strips in the surface layer, said channel penetrating slightly into said deep layer, selectively depositing silica on the entire wafer filling each channel level with the bottom portion of said first deposits, said substance producing by oxidation and also by chlorination during the deposition of silica a compound having a density appreciably lower than the density of said substance, and then removing said first deposits by a specific solvent and forming insulating walls around said surface zones by the remaining silica.

2. A method according to claim 1, deposition of said substance being uniform, and defining the deposition zones by etching.

3. A method according to claim 1 said substance being a transition metal.

4. A method according to claim 3, wherein said transition metal is molybdenum.

5. A method according to claim 1 including the steps of depositing doped silica on the first deposit, then depositing a uniform deposition of silica in a gas phase and in an oxidizing medium over the entire wafer to swell the substance of said first deposit and to break the portion of silica which covers said substance and then removing said portion by a specific solvent for doped silica.

6. A method according to claim 5, the doped silica being doped with phosphorus.

7. A method according to claim 1 including the step of subjecting the substrate to a gas flow containing silane and oxygen to selectively deposit the silica.

8. A method according to claim 7, the deposition of silica in the gas phase being at a temperature on the order of 400° C.

9. A method according to claim 7, the gas phase including hydrogen chloride gas.

10. A method according to claim 9, wherein the mole percentage of hydrogen chloride is on the order of 0.4% and wherein the mole percentage of oxygen is on the order of 2.5%.

11. A method according to claim 5, the first deposit being molybdenum.

12. A method according to claim 7, the first deposit being molybdenum.

* * * * *